United States Patent
Kasprowicz et al.

(10) Patent No.: US 9,005,849 B2
(45) Date of Patent: Apr. 14, 2015

(54) PHOTOMASK HAVING A REDUCED FIELD SIZE AND METHOD OF USING THE SAME

(75) Inventors: Bryan S. Kasprowicz, Dallas, TX (US); Christopher J. Progler, Plano, TX (US)

(73) Assignee: Photronics, Inc., Brookfield, CT (US)

( * ) Notice: Subject to any disclaimer, the term of this patent is extended or adjusted under 35 U.S.C. 154(b) by 0 days.

(21) Appl. No.: 12/820,905

(22) Filed: Jun. 22, 2010

(65) Prior Publication Data

US 2011/0086511 A1 Apr. 14, 2011

Related U.S. Application Data

(63) Continuation-in-part of application No. 12/486,564, filed on Jun. 17, 2009.

(51) Int. Cl.
*G03F 1/14* (2006.01)
*G03F 1/00* (2012.01)

(52) U.S. Cl.
CPC ........................................ *G03F 1/14* (2013.01)

(58) Field of Classification Search
USPC ............................................................. 430/5
See application file for complete search history.

(56) References Cited

U.S. PATENT DOCUMENTS

| | | | |
|---|---|---|---|
| 2,751,294 A | 6/1956 | Morrison | |
| 3,716,296 A | 2/1973 | Springer et al. | |
| 3,900,737 A | 8/1975 | Collier et al. | |
| 3,940,273 A | 2/1976 | Woodham et al. | |
| 4,013,502 A | 3/1977 | Staples | |
| 4,374,911 A | 2/1983 | Hartley | |
| 5,272,744 A | 12/1993 | Itou et al. | |
| 5,472,814 A | 12/1995 | Lin | |
| 5,523,186 A | 6/1996 | Lin et al. | |
| 5,593,800 A * | 1/1997 | Fujioka et al. | 430/5 |
| 5,604,059 A | 2/1997 | Imura et al. | |
| 5,670,080 A | 9/1997 | Gu | |
| 5,702,847 A * | 12/1997 | Tarumoto et al. | 430/5 |
| 5,817,439 A | 10/1998 | Tzu et al. | |
| 5,866,280 A | 2/1999 | Ito et al. | |

(Continued)

FOREIGN PATENT DOCUMENTS

| | | |
|---|---|---|
| JP | 61292145 | 12/1986 |
| JP | 04345162 | 12/1992 |

(Continued)

OTHER PUBLICATIONS

Hector et al., "Shifting Pattern Data to Avoid Mask Blank Defects", published Nov. 20, 2001 at www.IP.com, all 5 pages.*

(Continued)

*Primary Examiner* — Stephen Rosasco
(74) *Attorney, Agent, or Firm* — Amster, Rothstein & Ebenstein LLP

(57) ABSTRACT

A photomask used for manufacturing a semiconductor device includes a substrate; and one or more layers disposed over the substrate, the one or more layers defining a full field area and a reduced field area with a primary pattern being formed in the reduced field area, wherein the full field area is defined by a width of at least 90 mm and a length of at least 100 mm, and the reduced field area is defined by a width within the range of approximately 20-80 mm and a length within the range of approximately 20-80 mm, a center point of the primary patterned area being spaced a predetermined distance from a center point of the photomask so that the primary patterned area avoids photomask defects.

23 Claims, 17 Drawing Sheets

(56) References Cited

U.S. PATENT DOCUMENTS

| | | |
|---|---|---|
| 5,874,198 A | 2/1999 | Okino |
| 5,917,579 A | 6/1999 | Miyajima |
| 5,985,492 A | 11/1999 | Wheeler et al. |
| 6,004,699 A | 12/1999 | Yasuzato et al. |
| 6,042,972 A | 3/2000 | Schulze |
| 6,103,429 A | 8/2000 | Doyle et al. |
| 6,136,517 A | 10/2000 | Fletcher |
| 6,139,998 A | 10/2000 | Mochizuki et al. |
| 6,153,342 A | 11/2000 | Doyle et al. |
| 6,194,015 B1 | 2/2001 | Garrett |
| 6,200,709 B1 | 3/2001 | Nuytkens et al. |
| 6,225,013 B1 | 5/2001 | Cohen et al. |
| 6,251,545 B1 | 6/2001 | Levinson |
| 6,280,888 B1 | 8/2001 | Nakabayashi et al. |
| 6,348,287 B1 | 2/2002 | Lin |
| 6,421,111 B1 | 7/2002 | Pierrat |
| 6,451,488 B1 | 9/2002 | Rhodes |
| 6,451,508 B1 | 9/2002 | Bukofsky et al. |
| 6,455,203 B1 | 9/2002 | Amemiya et al. |
| 6,455,438 B1 | 9/2002 | Yanagisawa et al. |
| 6,472,107 B1 | 10/2002 | Chan |
| 6,472,766 B2 | 10/2002 | Xiao |
| 6,485,869 B2 | 11/2002 | Tsai et al. |
| 6,500,587 B1 | 12/2002 | Ghandchari et al. |
| 6,528,216 B2 | 3/2003 | Park |
| 6,536,032 B1 | 3/2003 | Tanaka et al. |
| 6,541,165 B1 | 4/2003 | Pierrat |
| 6,541,166 B2 | 4/2003 | Mansfield et al. |
| RE38,126 E | 5/2003 | Tew et al. |
| 6,567,588 B2 | 5/2003 | Unruh |
| 6,569,583 B2 | 5/2003 | Cho et al. |
| 6,576,378 B2 | 6/2003 | Kim |
| 6,620,561 B2 | 9/2003 | Winder et al. |
| 6,646,722 B2 | 11/2003 | Pierrat |
| 6,653,026 B2 | 11/2003 | Pierrat et al. |
| 6,677,088 B2 | 1/2004 | Magome et al. |
| 6,710,851 B1 | 3/2004 | Elmer et al. |
| 6,713,231 B1 | 3/2004 | Hasegawa et al. |
| 6,723,475 B2 | 4/2004 | Tsukamoto et al. |
| 6,775,815 B2 | 8/2004 | Ki et al. |
| 6,893,779 B2 | 5/2005 | Kim et al. |
| 6,924,083 B2 | 8/2005 | Huang et al. |
| 6,936,831 B2 | 8/2005 | Fujiwara et al. |
| 6,993,085 B2 | 1/2006 | Le Dantec |
| 7,008,730 B2 | 3/2006 | Lin |
| 7,029,804 B2 | 4/2006 | McCullough |
| 7,037,791 B2 | 5/2006 | Choo et al. |
| 7,052,986 B2 | 5/2006 | Yamazaki |
| 7,063,921 B2 | 6/2006 | Dettman et al. |
| 7,079,235 B2 | 7/2006 | Lehman |
| 7,087,350 B2 | 8/2006 | Wang |
| 7,147,974 B2 | 12/2006 | Chance et al. |
| 7,255,978 B2 | 8/2007 | Steinberg et al. |
| 7,262,828 B2 | 8/2007 | Kuroda et al. |
| 7,264,415 B2 | 9/2007 | Furukawa et al. |
| 7,300,823 B2 | 11/2007 | Franosch et al. |
| 7,303,843 B2 | 12/2007 | Maruko |
| 7,312,004 B2 | 12/2007 | Xiao |
| 2001/0006753 A1* | 7/2001 | Inoue ............................ 430/5 |
| 2003/0036293 A1 | 2/2003 | Tanaka et al. |
| 2003/0039897 A1 | 2/2003 | Morita |
| 2003/0134205 A1 | 7/2003 | Yu |
| 2004/0072083 A1 | 4/2004 | Saitou et al. |
| 2004/0161679 A1* | 8/2004 | Dai et al. ........................ 430/5 |
| 2004/0209193 A1 | 10/2004 | Pierrat et al. |
| 2004/0224243 A1 | 11/2004 | Yoshizawa et al. |
| 2005/0118515 A1 | 6/2005 | Progler et al. |
| 2005/0186487 A1* | 8/2005 | Inazuki et al. .................... 430/5 |
| 2005/0238966 A1 | 10/2005 | Nolscher |
| 2005/0277033 A1 | 12/2005 | Rockwell |
| 2006/0035156 A1 | 2/2006 | Yang |
| 2006/0088772 A1 | 4/2006 | Zhang |
| 2006/0138083 A1 | 6/2006 | Ryan et al. |
| 2006/0272572 A1 | 12/2006 | Uematsu et al. |
| 2007/0003841 A1 | 1/2007 | Choi |
| 2007/0228610 A1 | 10/2007 | Sreenivasan et al. |
| 2008/0018981 A1 | 1/2008 | Jain et al. |

FOREIGN PATENT DOCUMENTS

| | | |
|---|---|---|
| JP | 07168344 | 7/1995 |
| JP | 08029963 | 2/1996 |
| JP | 08179492 | 7/1996 |
| JP | 10031300 | 2/1998 |
| JP | 2000119841 | 4/2000 |
| JP | 2000150347 | 5/2000 |
| JP | 2003315974 | 11/2003 |
| JP | 2004079981 | 3/2004 |
| JP | 2004214526 | 7/2004 |
| WO | 2007039161 | 4/2007 |

OTHER PUBLICATIONS

Prmanik, Dipankar, Kamberian, Henry, Progler, Christopher, Sanie, Michael, and Pinto, David, "Cost effective strategies for ASIC masks," Cost and Performance in Integrated Circuit Creation, 2003; vol. 5043; pp. 142-152; San Jose, CA, US.

Kasprowicz, Bryan, "Analysis of 65nm Metal Layer Data," Confidential Presentation for Photronics Inc., Sep. 30, 2008, ISMI, pp. 1-29, Dallas, TX, US.

Kasprowicz, Bryan, "Analysis of Chartered Data," Confidential Presentation for Photronics Inc., Jun. 18, 2008, Chartered, pp. 1-40, Dallas, TX, US.

Progler, Christopher, "Focus areas for mask costs," Confidential Presentation for Photronics Inc., Jan. 2008 Chartered Visit, pp. 1-21, Dallas, TX, US.

Photronics Inc., "Motorola/Photronics—HiP7 Cost Reduction Effort—Jul. 11, 2003," Confidential Presentation for Photronics Inc., pp. 1-17, Dallas, TX, US.

\* cited by examiner

| Attribute | Relative Time | | | | |
|---|---|---|---|---|---|
| | SLR-Full | MLR4 | MLR3 | MLR2 | SLR-Reduced |
| FE Setup Time | 1.00 | 1.35 | 1.25 | 1.15 | 1.05 |
| Write Time | 1.00 | 0.66 | 0.63 | 0.59 | 0.56 |
| Inspection Time | 1.00 | 0.88 | 0.64 | 0.44 | 0.15 |
| Metrology | 1.00 | 1.25 | 1.15 | 1.10 | 0.85 |
| Repair | 1.00 | 1.25 | 1.20 | 1.10 | 0.65 |

30

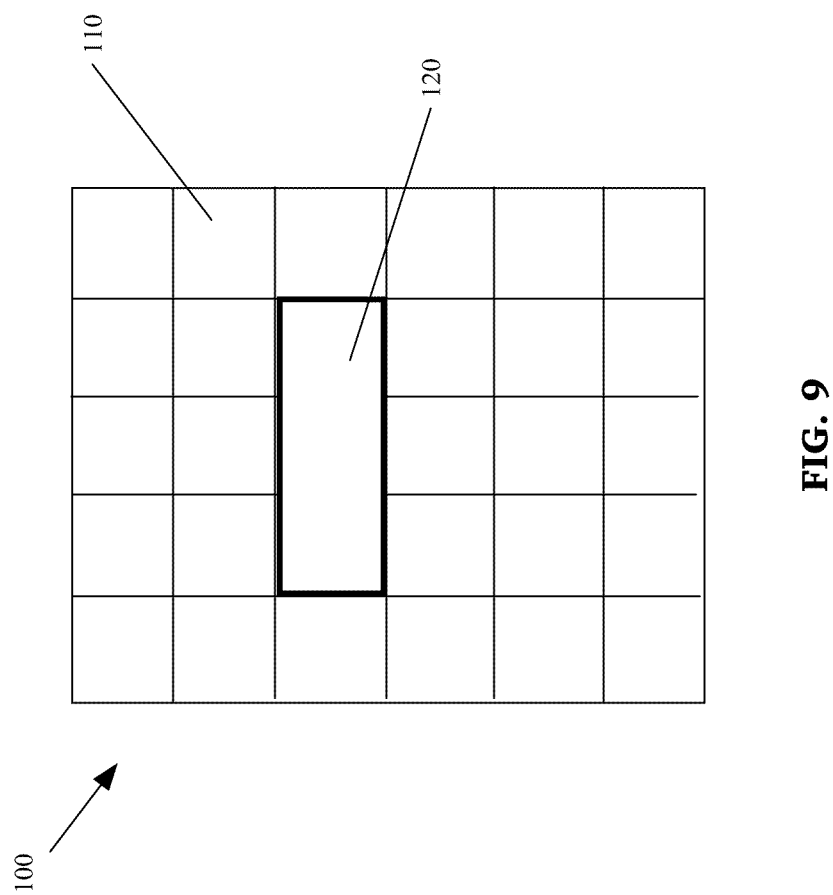

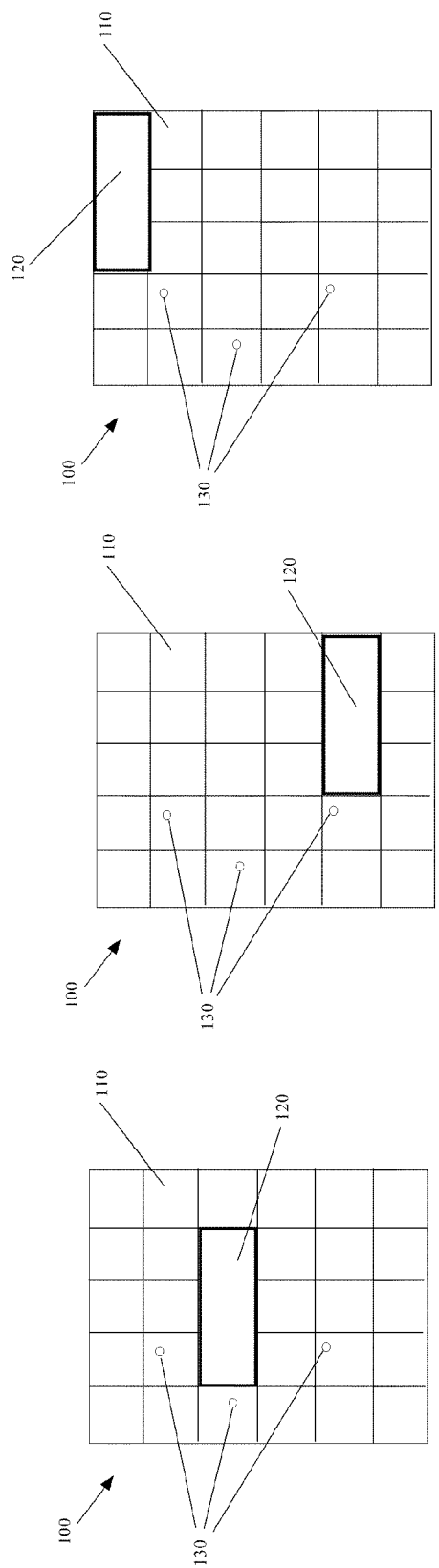

US 9,005,849 B2

PHOTOMASK HAVING A REDUCED FIELD SIZE AND METHOD OF USING THE SAME

RELATED APPLICATIONS

This application is a continuation-in-part of U.S. patent application Ser. No. 12/486,564, entitled "Photomask Having a Reduced Field Size and Method of Using the Same", filed Jun. 17, 2009, which claims priority to U.S. Provisional Patent Application No. 61/073,321, entitled "Small Field Photomask", filed Jun. 17, 2008, the contents of which are incorporated herein by reference in their entirety.

FIELD OF THE INVENTION

The present invention relates to photomasks used in semiconductor wafer fabrication and methods of manufacturing the same. In particular, the present invention relates to a photomask having a reduced field size and method of using the same.

SUMMARY OF THE INVENTION

A photomask used for manufacturing a semiconductor device according to an exemplary embodiment of the present invention comprises: a substrate; and one or more layers disposed over the substrate, the one or more layers defining a full field area and a reduced field area with a primary pattern being formed in the reduced field area, wherein the full field area is defined by a width of at least 90 mm and a length of at least 100 mm, and the reduced field area is defined by a width within the range of approximately 20-80 mm and a length within the range of approximately 20-80 mm, a center point of the primary patterned area being spaced a predetermined distance from a center point of the photomask so that the primary patterned area avoids photomask defects.

A method of forming a semiconductor device according to an exemplary embodiment of the present invention comprises the steps of: providing a photomask comprising a substrate and one or more layers disposed over the substrate, the one or more layers defining a full field area and a reduced field area with a primary pattern being formed in the reduced field area, wherein the full field area is defined by a width of at least 90 mm and a length of at least 100 mm, and the reduced field area is defined by a width within the range of approximately 20-80 mm and a length within the range of approximately 20-80 mm, a center point of the primary patterned area being spaced a predetermined distance from a center point of the photomask so that the primary patterned area avoids photomask defects; generating energy in the energy source; transmitting the generated energy through the reduced field area of the photomask; and etching an image on the semiconductor wafer corresponding to a pattern formed by the energy transmitted through the photomask.

In at least one embodiment, the width of the reduced field area is within the range of approximately 40-80 mm.

In at least one embodiment, the width of the reduced field area is within the range of approximately 40-60 mm.

In at least one embodiment, the width of the reduced field area is within the range of approximately 60-80 mm.

In at least one embodiment, the width of the reduced field area is approximately 60 mm.

In at least one embodiment, the length of the reduced field area is within the range of approximately 40-80 mm.

In at least one embodiment, the length of the reduced field area is within the range of approximately 40-60 mm.

In at least one embodiment, the length of the reduced field area is within the range of approximately 60-80 mm.

In at least one embodiment, the length of the reduced field area is approximately 20 mm.

In at least one embodiment, the one or more layers comprise at least one antireflective layer.

In at least one embodiment, the one or more layers comprise at least one opaque layer.

In at least one embodiment, the one or more layers comprise at least one partially transparent layer.

In at least one embodiment, the center point of the primary patterned area is spaced a predetermined distance from a center point of the photomask.

In at least one embodiment, the photomask is structured so as to be useful at a wavelength of 365 nm, 257 nm, 248 nm, 193 nm, or EUV within the range of approximately 13.5 nm-13.6 nm.

In at least one embodiment, the photomask is structured so as to be useful at a technology node of 130 nm or below.

In at least one embodiment, the wavelength of the generated energy is 365 nm, 257 nm, 248 nm, 193 nm, or EUV within the range of approximately 13.5 nm-13.6 nm.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein:

FIG. 9 is a plan view of a photomask according to an exemplary embodiment of the present invention;

FIGS. 14A-14C are plan views of a photomask according to various exemplary embodiments of the present invention.

DETAIL DESCRIPTION OF THE PREFERRED EMBODIMENT(S)

The present invention is directed to a photomask including a single reduced field of one or more patterned layers that can be used in a lithography process to form a semiconductor device. Conventional photomasks are made up of one or more layers that are intended to be patterned so that radiation may be passed through the patterned layers to form corresponding semiconductor structures. In the conventional process, the full field of the photomask is used to form the semiconductor structures. For the current generation of technology, the full field size has a width within the range of approximately 96-108 mm and a height within the range of approximately 100-132 mm. In the present invention, only a small portion of the full field (i.e., "reduced field") of the one or more layers are actually used in a semiconductor manufacturing process. In this regard, in the present disclosure, the term "reduced field" refers to the primary pattern within and smaller than the full field defined by the one or more layers. The area inside the full field but outside the reduced field may either contain no patterned material or may be filled with a dummy pattern to account for loading or other effects. As is known in the art, dummy fill is typically a series of regular patterns that are large relative to the minimum feature size in the primary pattern (e.g., 10 µm vs. 500 nm or less) that are not critical to the manufacture of the circuit design, but aid in the manufacture of the photomask by removing potential loading effects caused by irregular arrays in the resist development and etch process steps. In addition, as explained in further detail below, although the use of a reduced field photomask may reduce wafer productivity, such a photomask surprisingly provides significant advantages, such as, for example, reduced mask cycle time, increased mask flexibility, reduced mask inspection time, higher mask yield and reduction of mask specifications. The reduced field photomask according to various exemplary embodiments of the present invention may be ideally suited to the manufacture of low volume devices, such as prototype devices, although the present invention is not intended to be limited to such devices. Further, the reduced field photomask according to various exemplary embodiments of the present invention may be useful at wavelengths of 365 nm, 257 nm, 248 nm, 193 nm, and EUV of around 13.5-13.6 nm, and at technology nodes of 130 nm and below.

Figure 1:
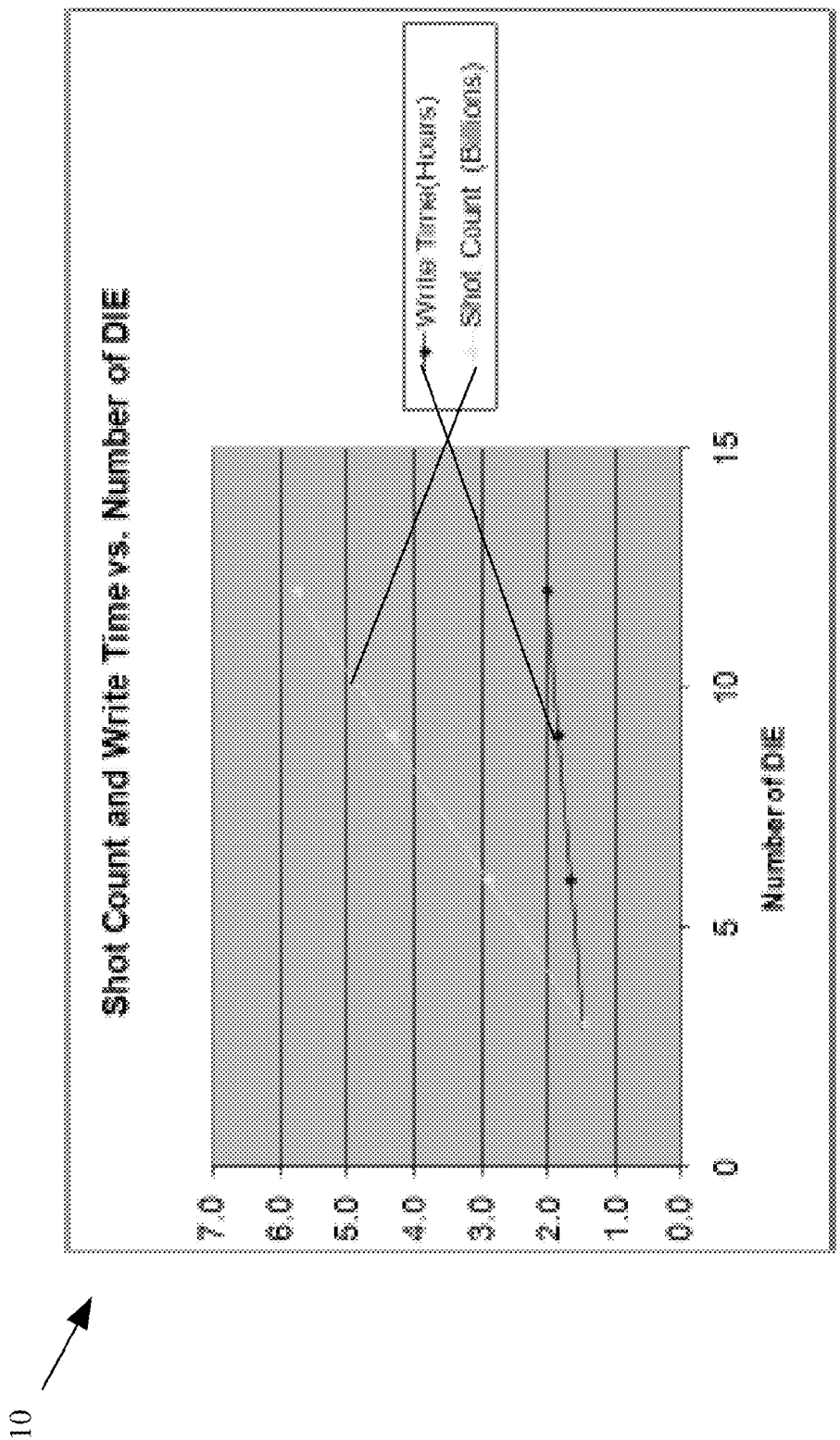
FIG. 1 shows a chart representing data regarding the number of dies that make up a photomask versus the shot count and write time for the photomask.

The cost of producing a mask is effected by a number of factors, such as, for example, e-beam write (data density), inspection (area, set up time), metrology (volume, move-acquire-measure (MAM) time and setup time), repair (the number of repairable defects) and yield (cycle time). In this regard, FIG. 1 shows a chart 10 representing data regarding the number of dies that make up a photomask versus the shot count and write time for the photomask. As is known in the art, the term "shot count" refers to the number of shots (exposure of an e-beam) required to pattern an entire design in a resist. The chart 10 shows that the shot count and write time generally increase as the number of die-dies increases. Conventional wisdom is that to reduce the cost of manufacturing a photomask for use in a semiconductor production line it is important to maximize the use of the available area of the photomask. Thus, to the extent that small field sizes have been proposed in the past in a photomask, the remainder of the photomask has been filled with other masks for the same layer, either having the same or other characteristics, such as different biases, as in U.S. patent application Ser. No. 10/866, 976, or for other layers from the same or different circuits, as in U.S. Pat. No. 6,710,851. As the present invention demonstrates, counter to this prevailing wisdom, when manufacturing a photomask for a limited run design, such as a prototype design, the inventors have surprisingly determined that it is more cost efficient to manufacture a photomask having a single mask design with a limited field size. This surprising result is demonstrated herein.

Figure 2:
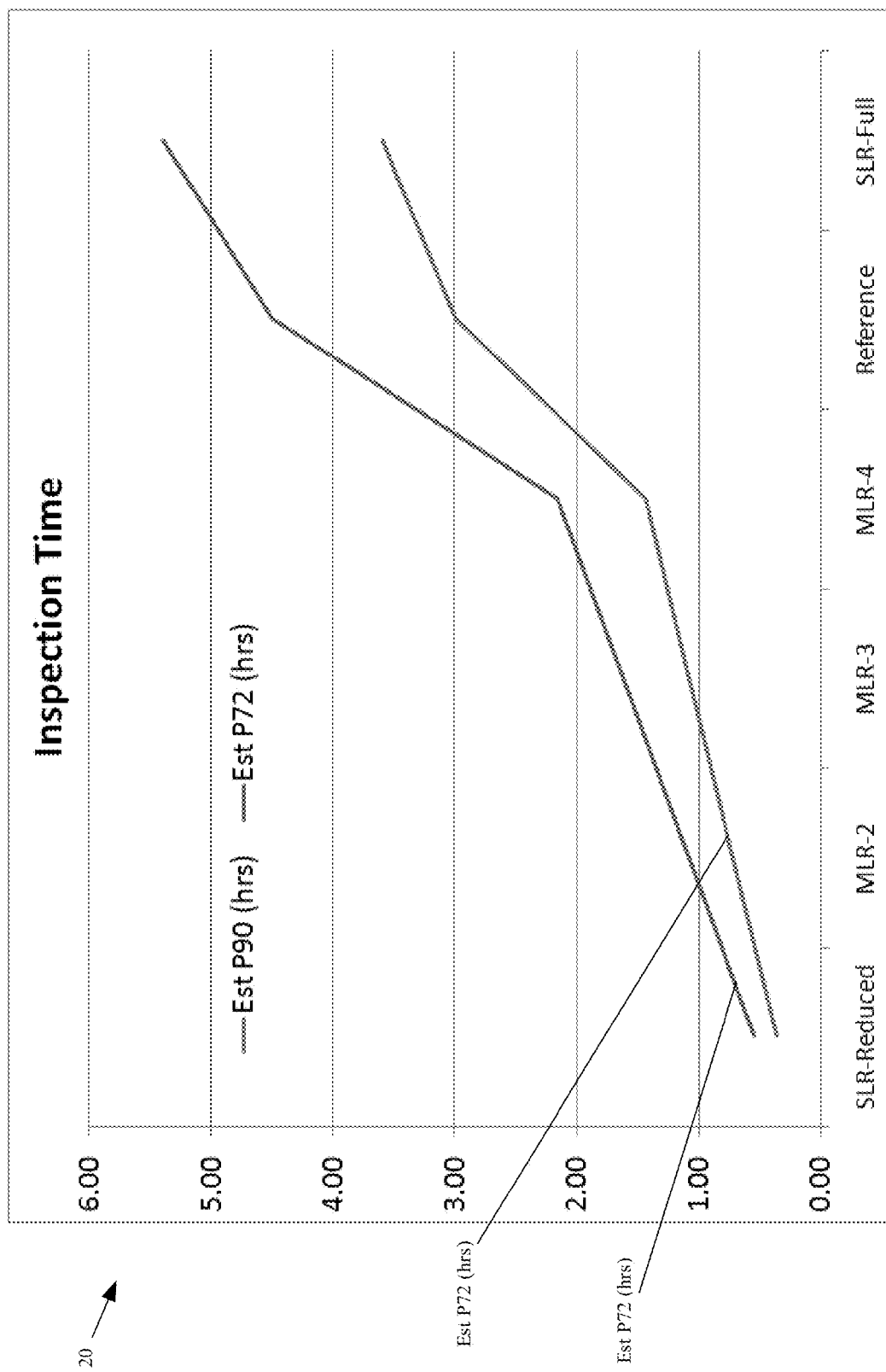
FIG. 2 shows a chart representing data regarding the number of layers represented on a single photomask versus the inspection time for the photomask.

Also, it is known in the art to use a multi-layer reticle, in which multiple layers of a semiconductor device are represented on a single photomask. See, for example, U.S. Pat. No. 6,710,851, and U.S. Pat. No. 7,396,617 assigned to the present assignee, the contents of which are incorporated herein by reference. FIG. 2 shows a chart 20 representing data regarding the number of layers represented on a single photomask versus the inspection time for the photomask. The chart 20 shows that the inspection time generally increases as the number of layers increase, with the lowest inspection time occurring when the number of layers represented on the photomask is one ("SLR-Reduced") (i.e., the photomask is a reduced field photomask).

Figure 3:
FIG. 3 shows a chart representing data regarding the process time for a number of process attributes for a small field photomask ("SLR-Reduced"), two-layer photomask ("MLR-2"), three-layer photomask ("MLR-3") and four-layer photomask ("MLR-4") relative to a full field photomask ("Full")
Figure 4:
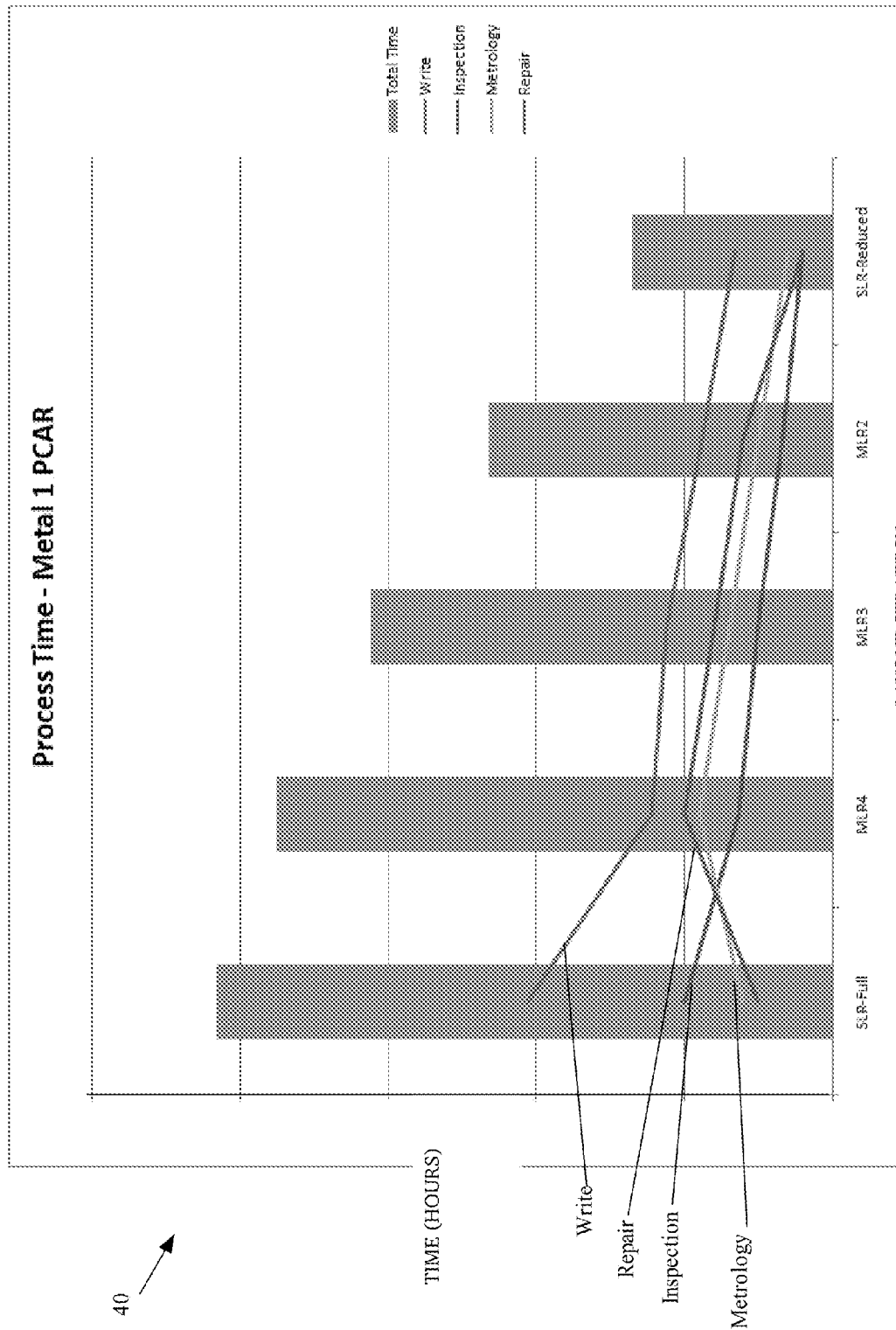
FIG. 4 shows a chart representing data regarding layout strategy versus overall process time, including time taken for various process steps.

FIG. 3 is a chart 30 showing the process time for a number of process attributes for a reduced field photomask (SLR-Reduced), two-layer photomask (MLR-2), three-layer photomask (MLR-3) and four-layer photomask (MLR-4) relative to a full field photomask (Full). The data in chart 30 shows that the relative write time, inspection time, metrology time, and repair time is the least for a reduced field size SLR-Reduced photomask. Using a reduced field SLR-Reduced results in the reduction of overall time of key, high cost process steps and decreases cycle time. An approximate 50% improvement in process time for key process attributes is possible. This is further shown in FIG. 4, which shows a chart 40 representing data regarding layout strategy versus overall process time, including time taken for various process steps. The chart 40 shows that the total process time is the lowest for a reduced field photomask SLR-Reduced.

Figure 5:
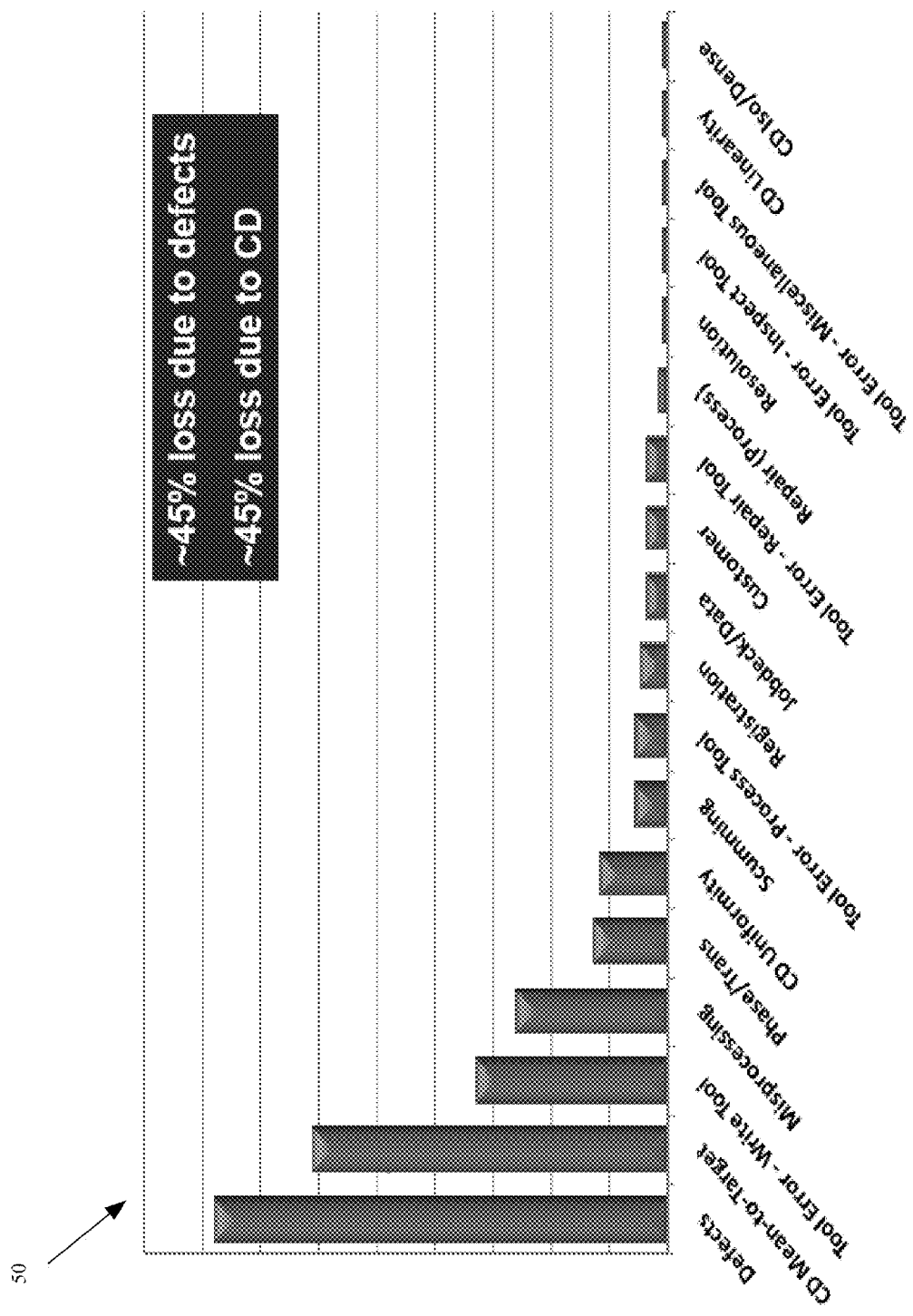
FIG. 5 shows a chart representing data regarding the relative effect on yield loss for a variety of process error types.
Figure 6:
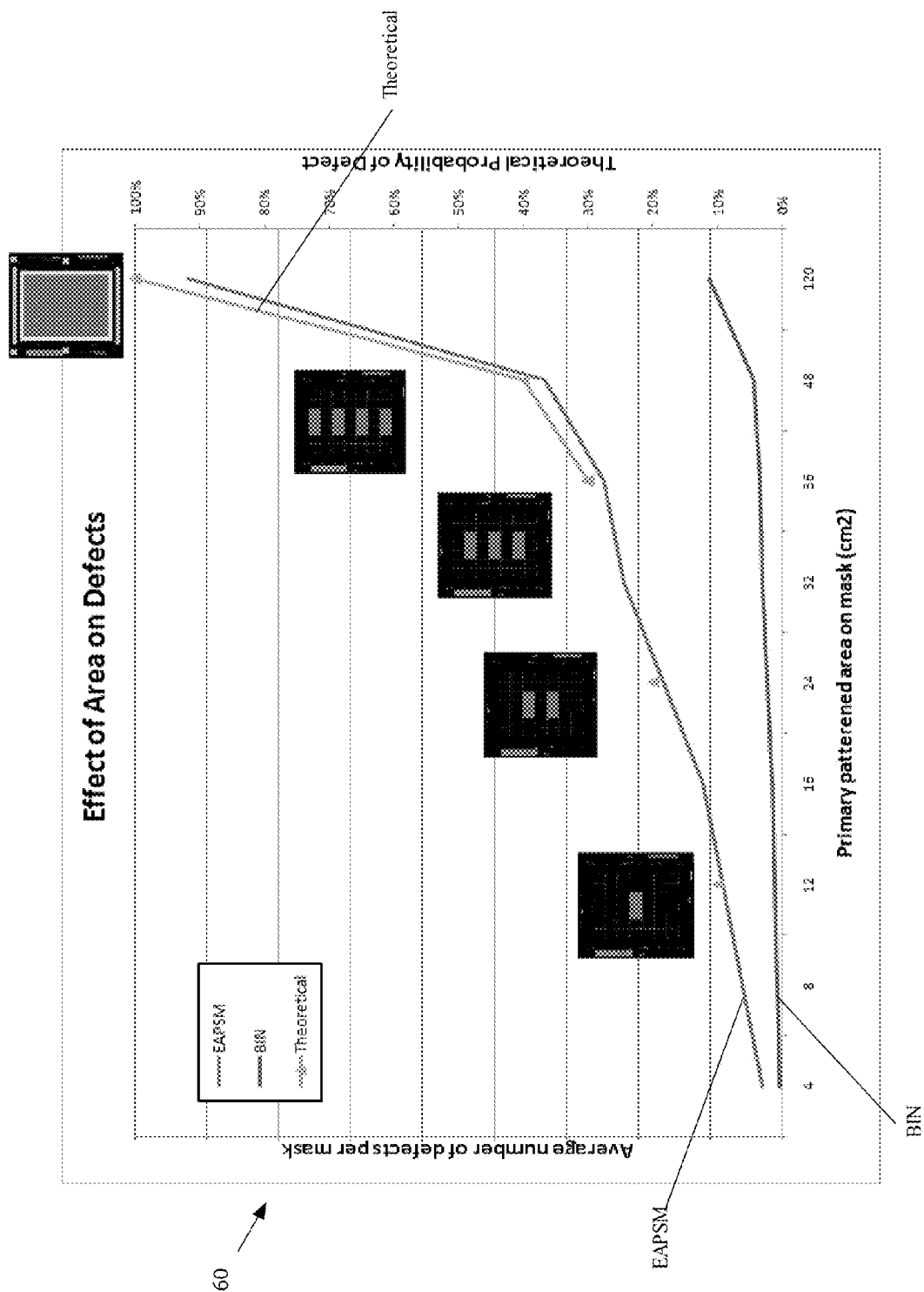
FIG. 6 shows a chart representing data related to defect density as a function of field size.

In addition to improving overall process time, a reduced field photomask increases yield. In this regard, FIG. 5 shows a chart 50 representing data regarding the relative effect on yield loss for a variety of process error types. The chart 50 shows that approximately 45% of yield loss is due to defects, and another approximately 45% of yield loss is due to critical dimension (CD) factors. Thus, the inventors discovered that the reduced field photomask is able to increase yield by reducing the number of defects occurring in the primary patterned area of the photomask, since, as shown in chart 60 of FIG. 6, defect density is a function of field size and a smaller field size reduces the probably of a defect landing in the primary patterned area.

Figure 7:
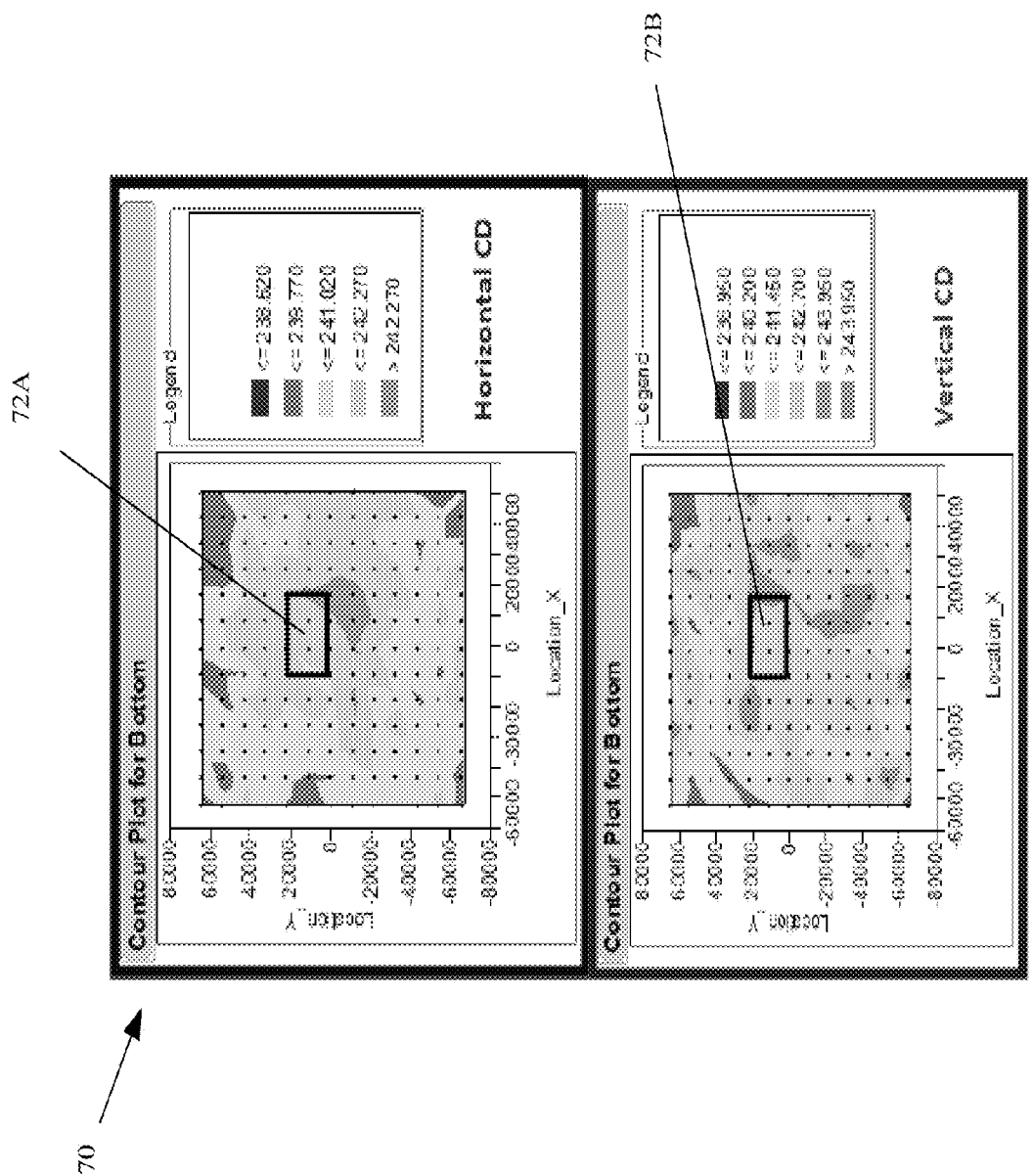
FIG. 7 shows the variations of the horizontal CD and vertical CD over the face of a mask.

The reduced field photomask according to the present invention also improves yield by improving CD-related factors, such as improved CD uniformity. For example, FIG. 7 illustrates how the use of a reduced field size can reduce costs and narrow variations in CD. FIG. 7 plots for an example layer the variations of the horizontal CD and vertical CD over the face of the mask. As can be seen in the Countour Plots, in the full field area, the variations in the horizontal CD and vertical CD range from 4-5 nm. However, in the reduced field area, labeled 72a and 72b, the horizontal CD and vertical CD range from only 2-3 nm. The tight CD control of the reduced field allows for better device parametric performance. In addition, by using a reduced field, a particular photomask whose CD's might require the use of more expensive photomask types, e.g., EAPSM, could potentially be migrated to a less expensive type of photomask, e.g., binary photomask, thus further reducing the costs.

Figure 8:
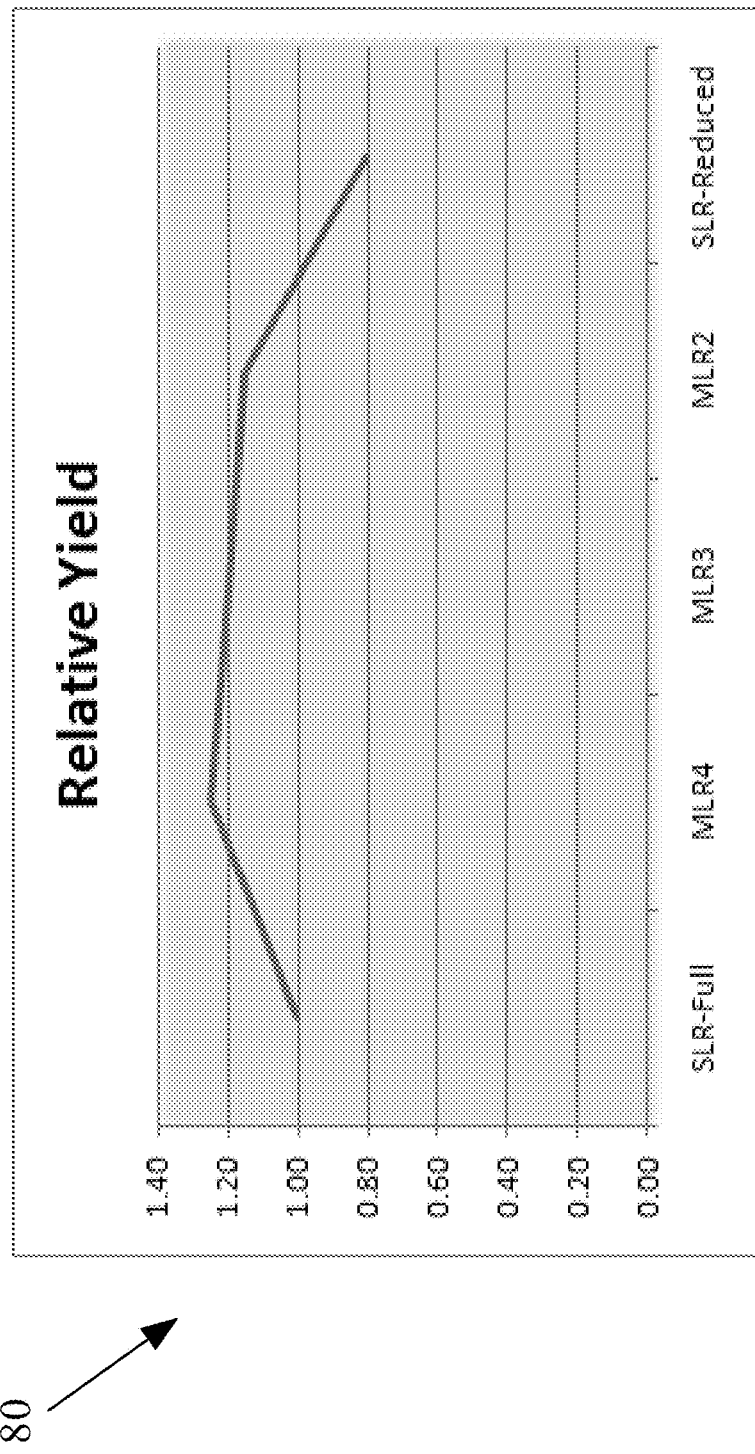
FIG. 8 shows a chart representing data regarding yield versus various layout strategies relative to a full field strategy.

In general, the use of a reduced field photomask improves the overall yield of a photomask manufacturing process. In this regard, FIG. 8 shows a chart 80 representing data regarding yield versus various layout strategies relative to a full field strategy. The chart 80 shows that the highest relative yield is achieved with a reduced field photomask.

FIG. 9 is a plan view of a photomask, generally designated by reference number 100, according to an exemplary embodiment of the present invention. The photomask 100 may include a plurality of dies 110, where each die 110 provides an area for the formation of a pattern that may be transferred to a semiconductor wafer (not shown). Although FIG. 1 shows the photomask 100 having a 5×6 die array, the present invention is not limited to this size array. A reduced field area 120 is formed within the photomask 100. The reduced field area 120 may be made up of one or more patterned dies 112 amongst the dies 110, with the remaining dies 110 being either patterned or unpatterned to fill the full field area of the photomask 100. By filling the unused area of the photomask with dummy fill, other advantage can be obtained, such as reduced macroloading effects. In an exemplary embodiment of the present invention, the reduced field area 120 may be made up of a 3×1 array of patterned dies 112, or some other suitable patterned die array that is smaller than the total die array size. Also, as shown in FIG. 9, the center-point of the reduced field area 120 may be spaced a predetermined distance from the center point of the photomask 100.

In an exemplary embodiment of the present invention, the predetermined distance that the center-point of the reduced field area 120 may be spaced from the center-point of the photomask 100 may be selected so that the reduced field area 120 avoids defects on the mask blank, or, in the case in which avoidance is not possible, minimizing the number of defects within the reduced field area 120. This avoidance of blank defects is particularly useful within the context of EUV technology, where providing a defect-free mask is critical. For example, as shown in FIGS. 14A-C, the center-point of the reduced field area 120 may be shifted around the center-point of the photomask 100 so as to avoid defects 130.

Figures 10A, 10B:
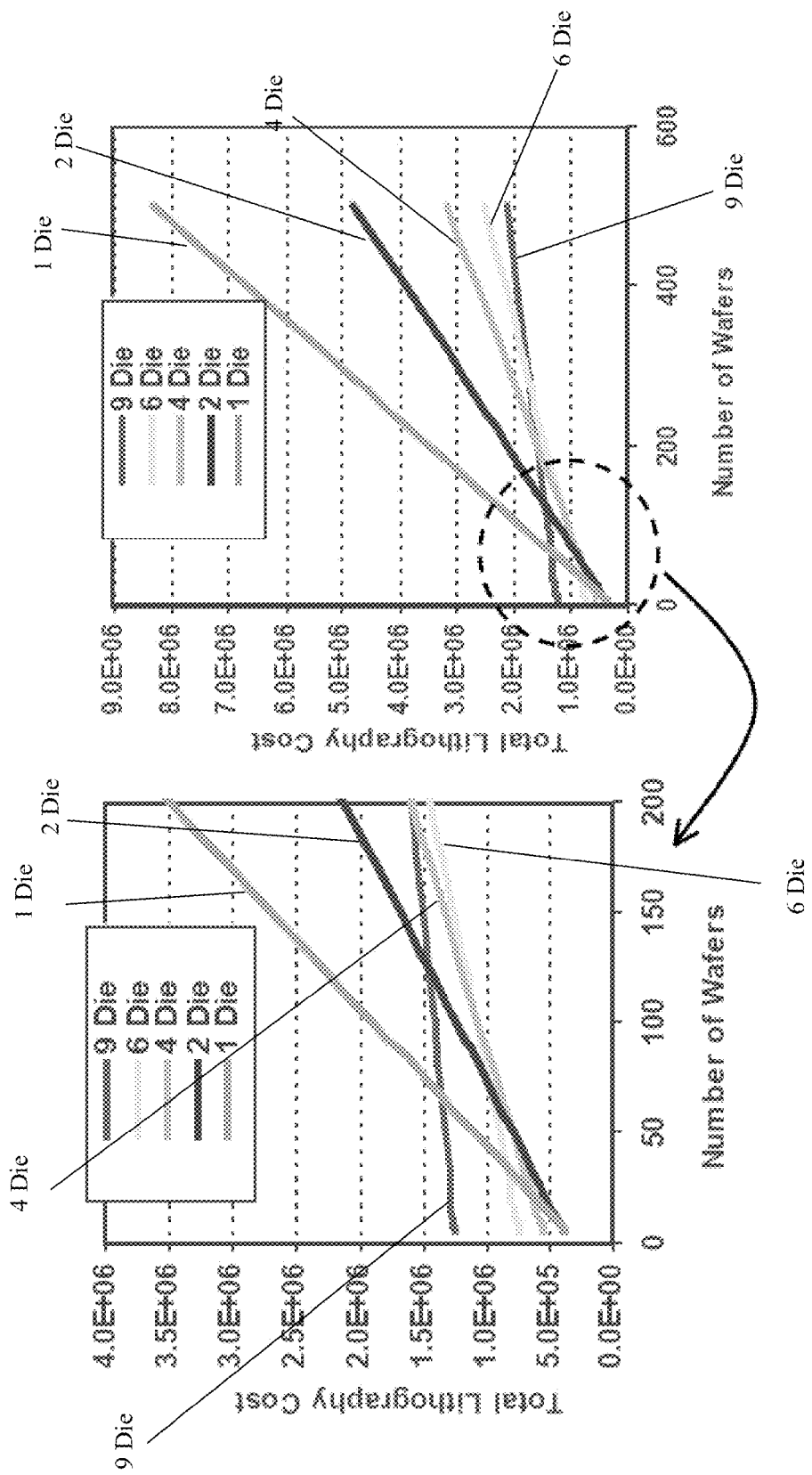
FIGS. 10A and 10B show charts representing data regarding the number of wafers produced versus the total lithography cost for five different reduced field sizes provided in terms of number of dies that make up the reduced field.

Regarding the number of die that make up the reduced field area 120, FIGS. 10A and 10B show charts 150, 160 representing data regarding the number of wafers produced versus the total lithography cost for five different reduced field sizes provided in terms of number of dies that make up the reduced field (1 die reduced field size, 2 die reduced field size, 4 die reduced field size, and 9 die reduced field size). As shown in the charts 150, 160, for the production of a relatively small number of wafers (e.g., less than approximately 200 wafers), the total lithography cost remains the lowest when using a reduced field size of approximately 4-6 die, although at very small wafer productions (e.g., less than approximately 25 wafers), the total lithography cost remains the lowest when using a reduced field size of approximately 1-2 die.

Figure 11A:
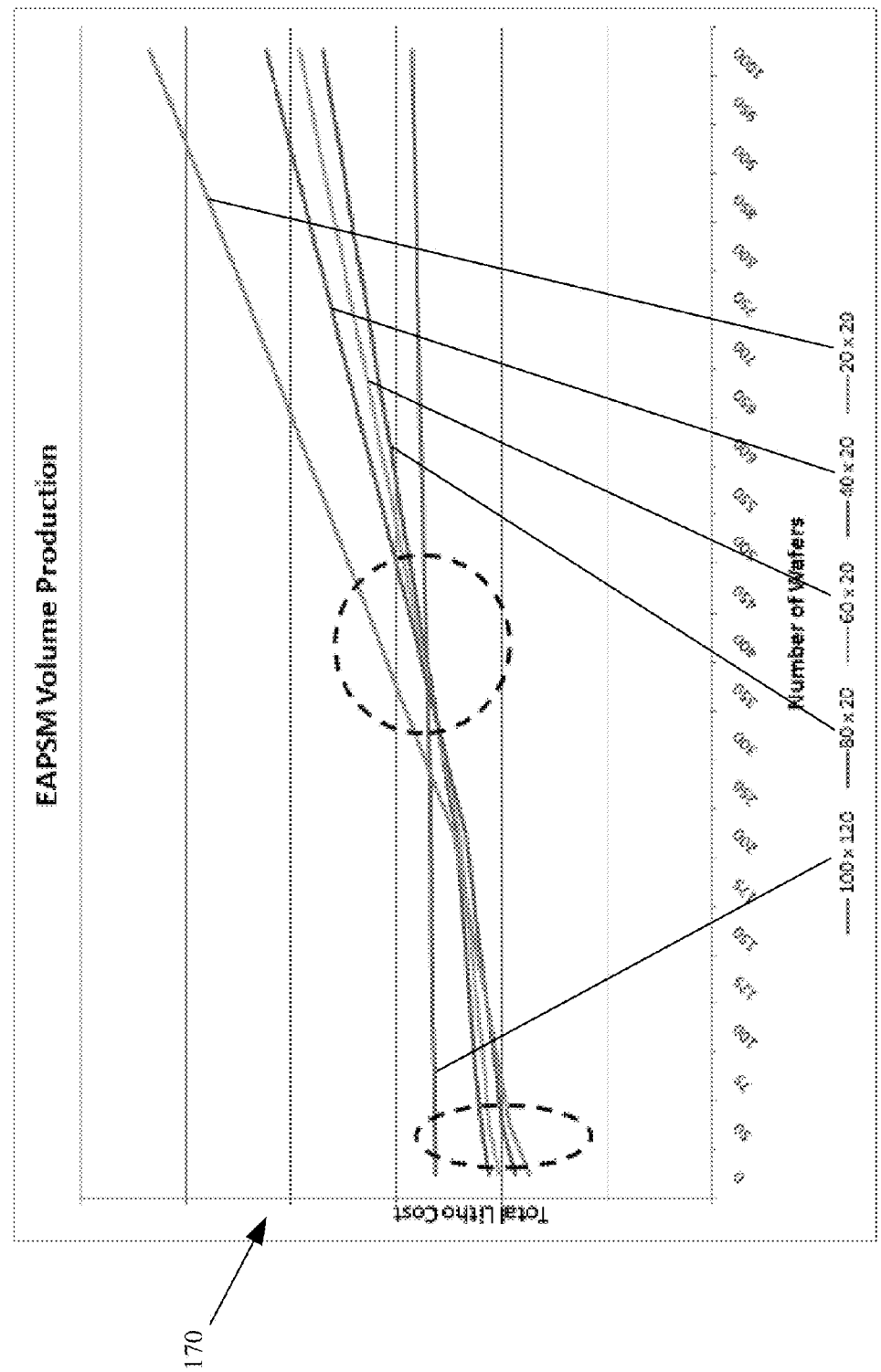
FIGS. 11A and 11B show charts representing data for an EAPSM and a binary mask regarding the number of wafers produced versus the total lithography cost for five different reduced field sizes in millimeters.
Figure 11B:
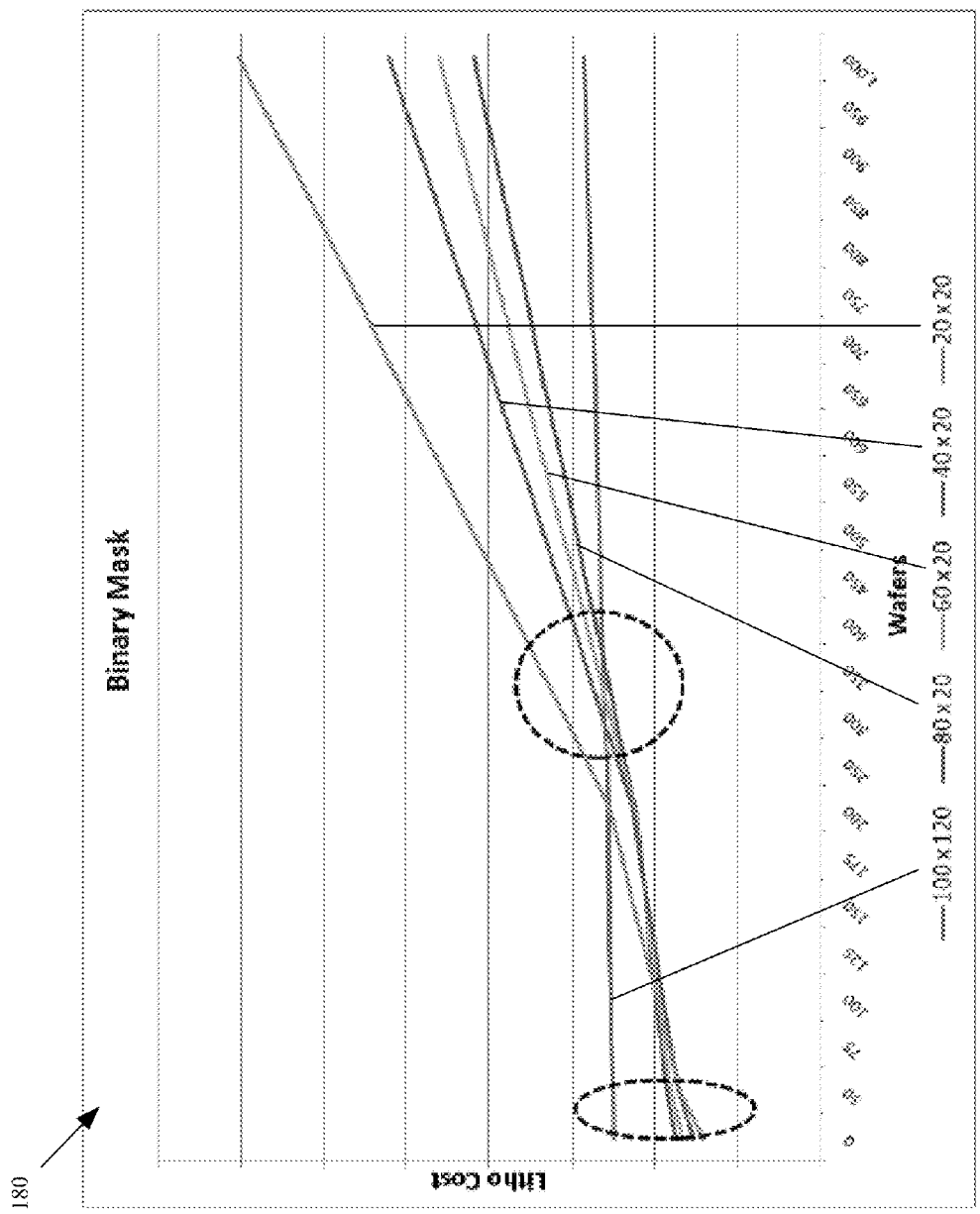

Regarding the total size of the reduced field area 120, FIGS. 11A and 11B show charts 170, 180 representing data for an EAPSM and a binary mask regarding the number of wafers produced versus the total lithography cost for five different reduced field sizes in millimeters (100×120, 80×20, 60×20, 40×20 and 20×20). In FIG. 11A, the reduced field photomask is an EAPSM, and in FIG. 11B, the reduced field photomask is a binary photomask. As shown in the charts 170, 180, for the production of a relatively small number of wafers (e.g., less than approximately 400 wafers), the total lithography cost remains the lowest when using a reduced field size within the range of approximately 20-80×20 mm, and for production of a smaller number of wafers (e.g., less than approximately 150), the total lithography cost remains the lowest when using a reduced field size with the range of approximately 40-60×20 mm, and preferably when using a reduced field size of approximately 60×20 mm.

Figure 12A:
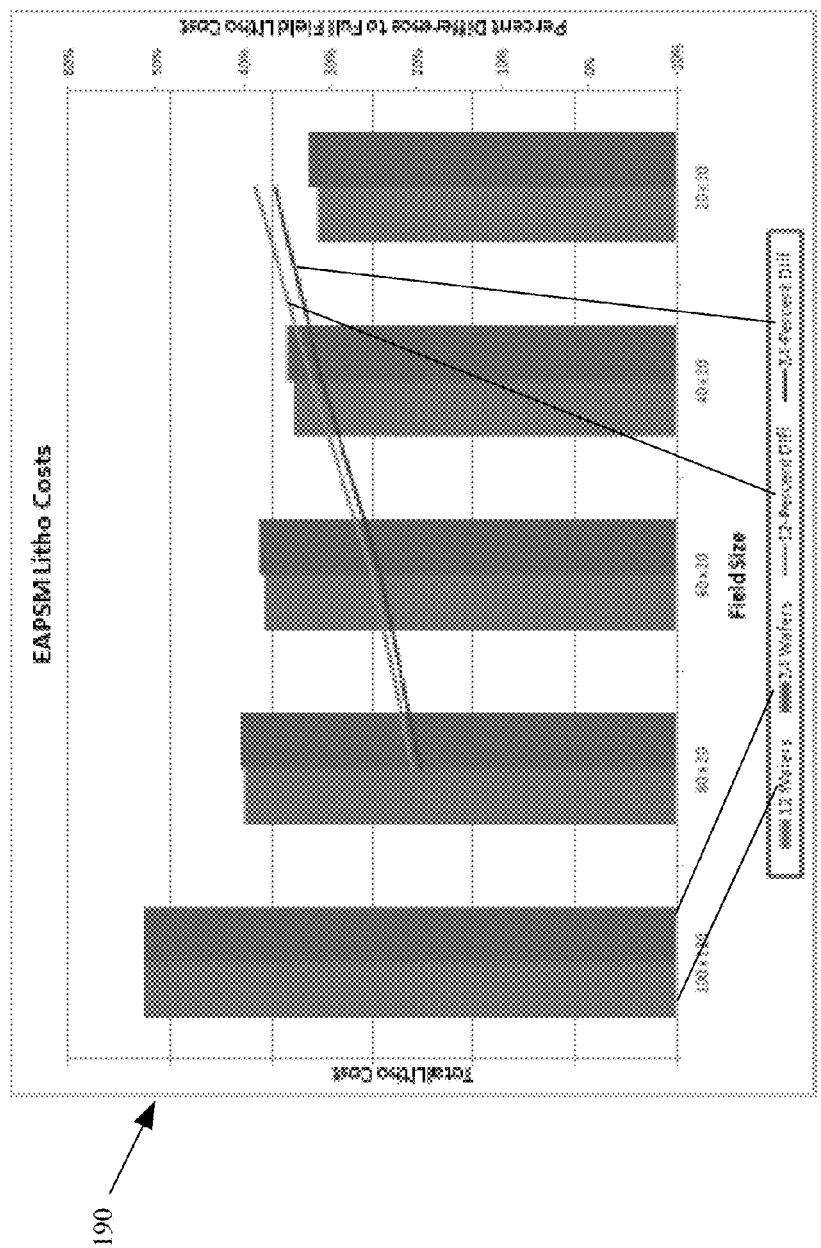
FIGS. 12A and 12B show charts representing data for an EAPSM and a binary mask regarding the percentage difference in total lithography cost resulting from using a reduced field size photomask as compared to using a full field photomask.
Figure 12B:
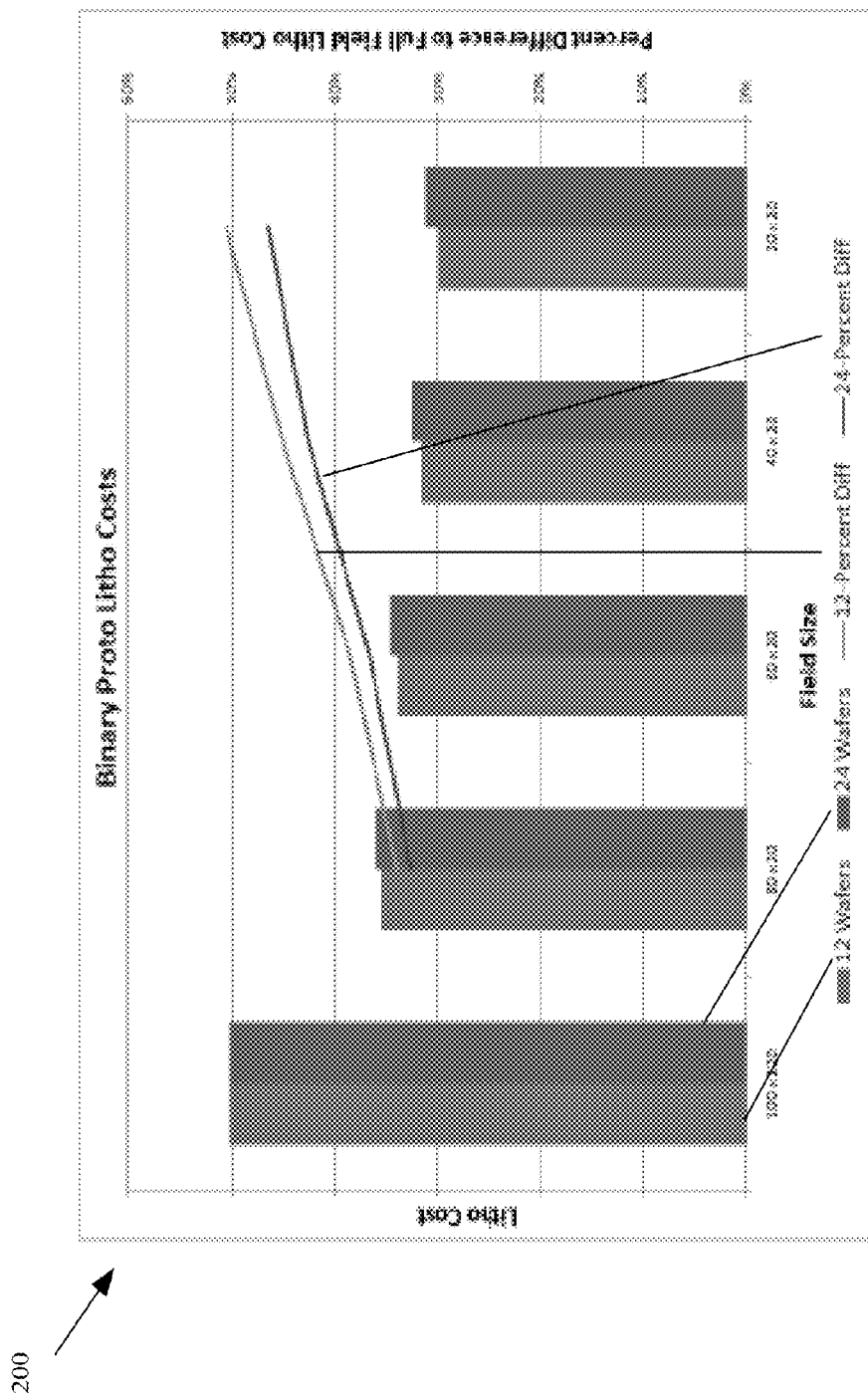

FIGS. 12A and 12B show charts 190, 200 representing data for an EAPSM and a binary mask regarding the percentage difference in total lithography cost resulting from using a reduced field size photomask as compared to using a full field photomask. In FIG. 12A, the reduced field photomask is an EAPSM, and in FIG. 12B, the reduced field photomask is a binary photomask. Charts 190, 200 show the percentage difference for five different field sizes in millimeters (100×120, 80×20, 60×20, 40×20 and 20×20) for wafer runs of 12 and 24 wafers. The data for an EAPSM and a binary mask in charts 190, 200 show that, as the field size is decreased, the percentage increase in cost relative to a full field photomask increases and the total lithography cost decreases. To achieve the least amount of relative increase in total lithography cost, while keeping the total lithography cost to a minimum, the data for an EAPSM and a binary mask shown in charts 190, 200 show that, for wafer runs of less than approximately 24 wafers, the reduced field size should be within the range of approximately 40-60×20 mm, and more preferably the field size should be approximately 60×20 mm.

Figure 13A:
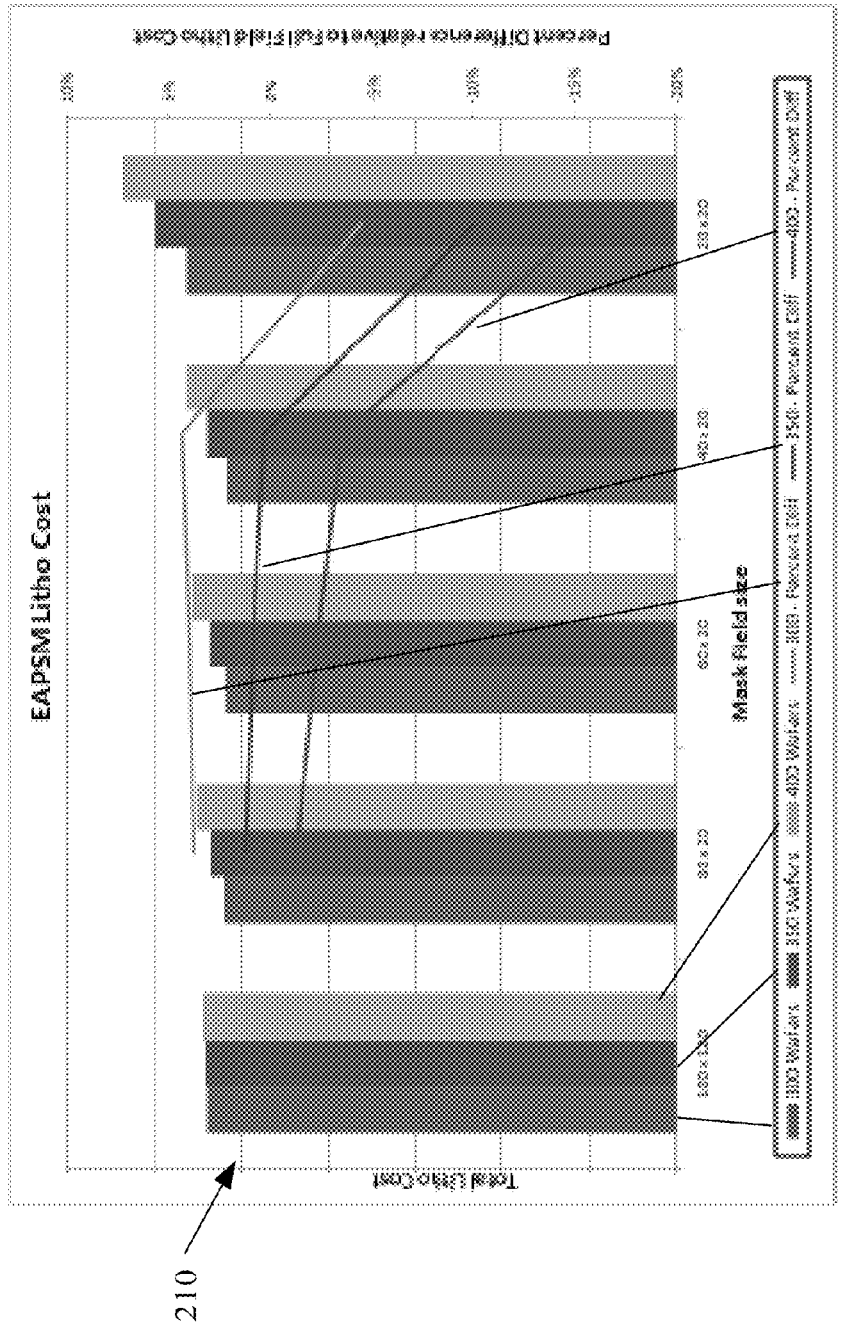
FIGS. 13A and 13B show charts 210, 220 representing data for an EAPSM and a binary mask regarding the percentage difference in total lithography cost resulting from using a reduced field size photomask as compared to using a full field photomask.
Figure 13B:
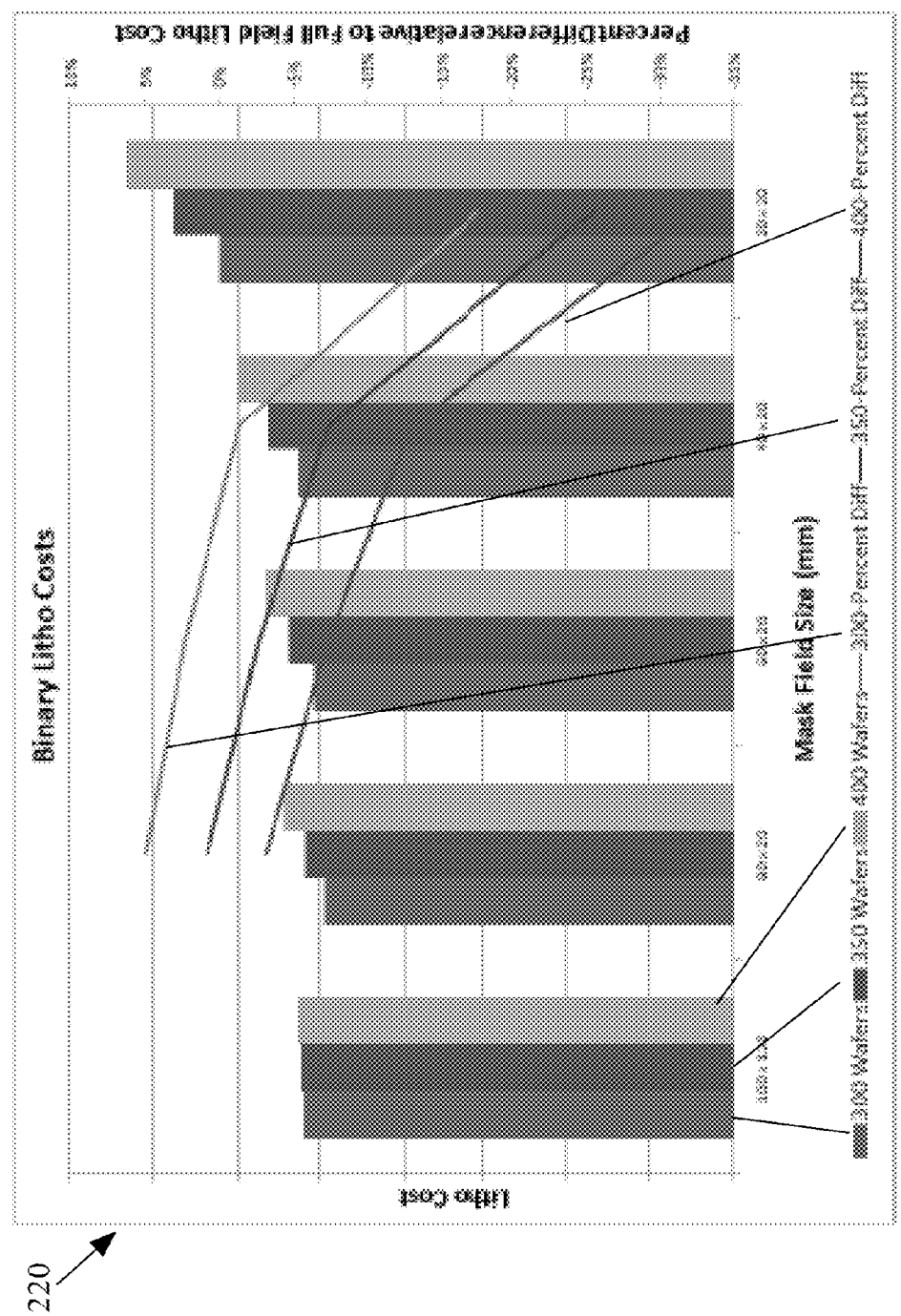

FIGS. 13A and 13B show charts 210, 220 representing data for an EAPSM and a binary mask regarding the percentage difference in total lithography cost resulting from using a reduced field size photomask as compared to using a full field photomask. In FIG. 13A, the reduced field photomask is an EAPSM, and in FIG. 13B, the reduced field photomask is a binary photomask. Charts 210, 220 show the percentage difference for five different reduced field sizes in millimeters (100×120, 80×20, 60×20, 40×20 and 20×20) for wafer runs of 300, 350 and 400 wafers. The data for an EAPSM and a binary mask in charts 210, 220 show that, as the reduced field size is decreased, the percentage increase in cost relative to a full field photomask generally decreases and the total lithography cost generally increases. To achieve the least amount of relative increase in total lithography cost, while keeping the total lithography cost to a minimum, the data for an EAPSM and a binary mask shown in charts 210, 220 show that, for wafer runs within the range of approximately 300-400 wafers, the reduced field size should be within the range of approximately 40-80×20 mm, more preferably within the range of approximately 60-80×20 mm, and even more preferably the reduced field size should be approximately 60×20 mm.

Now that the preferred embodiments of the present invention have been shown and described in detail, various modifications and improvements thereon will become readily apparent to those skilled in the art. Accordingly, the spirit and scope of the present invention is to be construed broadly and limited only by the appended claims and not by the foregoing specification.

What is claimed is:

1. A photomask used for manufacturing a semiconductor device comprising:
   a substrate;
   one or more layers disposed over the substrate that define one or more dies;
   a full field area comprising the one or more dies; and
   a reduced field area disposed within and reduced in size relative to the full field area and comprising a sub-set of the one or more dies, each die within the sub-set of the one or more dies comprising a corresponding pattern of an integrated circuit that is transferred to a semiconductor wafer and each die that is outside the sub-set of the one or more dies being un-patterned, wherein portions of the full field area outside the reduced field area contain defects and the reduced field area is devoid of defects and is defined by a width within the range of approximately 20-60 mm and a length within the range of approximately 20-70 mm, a center point of the reduced field area being offset from a center point of the photomask so that the full field area avoids photomask defects.

2. The photomask of claim 1, wherein the width of the reduced field area is within the range of approximately 40-60 mm.

3. The photomask of claim 1, wherein the width of the reduced field area is approximately 60 mm.

4. The photomask of claim 1, wherein the length of the reduced field area is within the range of approximately 40-70 mm.

5. The photomask of claim 1, wherein the length of the reduced field area is within the range of approximately 40-60 mm.

6. The photomask of claim 1, wherein the length of the reduced field area is approximately 20 mm.

7. The photomask of claim 1, wherein the one or more layers comprise at least one antireflective layer.

8. The photomask of claim 1, wherein the one or more layers comprise at least one opaque layer.

9. The photomask of claim 1, wherein the one or more layers comprise at least one partially transparent layer.

10. The photomask of claim 1, wherein the photomask is structured so as to be useful at a wavelength of 365 nm, 257 nm, 248 nm, 193 nm, or EUV within the range of approximately 13.5 nm-13.6 nm.

11. The photomask of claim 1, wherein the photomask is structured so as to be useful at technology nodes of 130 nm and below.

12. A method of forming a semiconductor device, comprising the steps of:
  providing a photomask comprising a substrate and one or more layers disposed over the substrate that define one or more dies, a full field area comprising the one or more dies and a reduced field area disposed within and reduced in size relative to the full field area and comprising a sub-set of the one or more dies, each die within the sub-set of the one or more dies comprising a corresponding pattern of an integrated circuit that is transferred to a semiconductor wafer and each die that is outside the sub-set of the one or more dies being un-patterned, wherein portions of the fill field area outside the reduced field area contain defects and the reduced field area is devoid of defects and is defined by a width within the range of approximately 20-60 mm and a length within the range of approximately 20-70 mm. a center point of the reduced field area being offset from a center point of the photomask so that the full field area avoids photomask defects;
  interposing the photomask between a semiconductor wafer and an energy source;
  generating energy in the energy source;
  transmitting the generated energy through the reduced field area of the photomask; and
  etching an image on the semiconductor wafer corresponding to a pattern formed by the energy transmitted through the photomask.

13. The method of claim 12, wherein the wavelength of the generated energy is 365 nm, 257 nm, 248 nm, 193 nm, or EUV within the range of approximately 13.5 nm-13.6 nm.

14. The method of claim 12, wherein the wavelength of the generated energy is 257 nm.

15. The method of claim 12, wherein the generated energy is EUV having a wavelength within the range of approximately 13.5 nm-13.6 nm.

16. The method of claim 12, wherein the width of the reduced field area is within the range of approximately 40-60 mm.

17. The method of claim 12, wherein the width of the reduced field area is approximately 60 mm.

18. The method of claim 12, wherein the length of the reduced field area is within the range of approximately 40-70 mm.

19. The method of claim 12, wherein the length of the reduced field area is within the range of approximately 40-60 mm.

20. The method of claim 12, wherein the length of the reduced field area is approximately 20 mm.

21. The method of claim 12, wherein the one or more layers comprise at least one antireflective layer.

22. The method of claim 12, wherein the one or more layers comprise at least one opaque layer.

23. The method of claim 12, wherein the one or more layers comprise at least one partially transparent layer.

* * * * *